United States Patent
Dong

(10) Patent No.: US 9,894,782 B2
(45) Date of Patent: Feb. 13, 2018

(54) FOLDABLE DISPLAY DEVICE AND DISPLAY APPARATUS

(71) Applicant: BOE TECHNOLOGY GROUP CO., LTD., Beijing (CN)

(72) Inventor: Tian Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/914,468

(22) PCT Filed: Jul. 20, 2015

(86) PCT No.: PCT/CN2015/084448
§ 371 (c)(1),
(2) Date: Feb. 25, 2016

(87) PCT Pub. No.: WO2016/138724
PCT Pub. Date: Sep. 9, 2016

(65) Prior Publication Data
US 2016/0381812 A1     Dec. 29, 2016

(30) Foreign Application Priority Data

Mar. 5, 2015   (CN) .......................... 2015 1 0097994

(51) Int. Cl.
*G06F 1/16*      (2006.01)
*H05K 5/00*      (2006.01)
(Continued)

(52) U.S. Cl.
CPC ......... *H05K 5/0017* (2013.01); *G06F 1/1652* (2013.01); *G09F 9/00* (2013.01); *G09F 9/301* (2013.01); *H05K 5/0217* (2013.01)

(58) Field of Classification Search
CPC ........................... G06F 1/1652; H04M 1/0268
See application file for complete search history.

(56) References Cited

U.S. PATENT DOCUMENTS 6,016,176 A  *  1/2000  Kim ................. G02F 1/133305
                                                        349/158
7,787,917 B2     8/2010  Aoki et al.
(Continued)

FOREIGN PATENT DOCUMENTS

CN         1689059 A     10/2005
CN       101573879 A     11/2009
(Continued)

OTHER PUBLICATIONS

Chinese Office Action in Chinese Application No. 201510097994.8, dated Sep. 2, 2016 with English translation.
(Continued)

*Primary Examiner* — Anthony Q Edwards
(74) *Attorney, Agent, or Firm* — Collard & Roe, P.C.

(57) ABSTRACT

A foldable display device and a display apparatus are provided. The foldable display device includes a supporting back plate and a display screen arranged in the front side of the supporting back plate. The supporting back plate includes a first supporting part and a second supporting part, and the first supporting part and the second supporting part may bend towards to the reverse side of the supporting back plate through a folding connection. One end of the display screen is fixedly connected to the first supporting part, and the other end of the display screen is slidably connected to the second supporting part.

15 Claims, 3 Drawing Sheets

(51) Int. Cl.
  *G09F 9/00*  (2006.01)
  *G09F 9/30*  (2006.01)
  *H05K 5/02*  (2006.01)

(56) References Cited

U.S. PATENT DOCUMENTS

| | | | |
|---|---|---|---|
| 7,953,462 B2* | 5/2011 | Harry | G06Q 30/02 345/173 |
| 8,194,399 B2* | 6/2012 | Ashcraft | G06F 1/1626 257/59 |
| 8,711,566 B2 | 4/2014 | O'Brien | |
| 8,787,016 B2* | 7/2014 | Rothkopf | H04M 1/0216 361/679.02 |
| 2006/0039098 A1 | 2/2006 | Slikkerveer et al. | |
| 2008/0158795 A1* | 7/2008 | Aoki | G06F 1/1616 361/679.27 |
| 2012/0002360 A1* | 1/2012 | Seo | G06F 1/1616 361/679.01 |
| 2012/0033353 A1 | 2/2012 | Huang | |
| 2012/0033354 A1 | 2/2012 | Huang | |
| 2012/0314399 A1* | 12/2012 | Bohn | G06F 1/1616 362/97.1 |
| 2014/0226275 A1* | 8/2014 | Ko | G06F 1/1626 361/679.27 |
| 2016/0381812 A1* | 12/2016 | Dong | G09F 9/00 361/679.01 |

FOREIGN PATENT DOCUMENTS

| | | |
|---|---|---|
| CN | 102902308 A | 1/2013 |
| CN | 103294113 A | 9/2013 |
| CN | 103608745 A | 2/2014 |
| CN | 103914273 A | 7/2014 |
| CN | 103985315 A | 8/2014 |
| CN | 104680940 A | 6/2015 |
| JP | H 11-231809 A | 8/1999 |

OTHER PUBLICATIONS

International Search Report of PCT/CN2015/084448 in Chinese, dated Nov. 25, 2015 with English translation.
Notice of Transmittal of the International Search Report of PCT/CN2015/084448 in Chinese, dated Nov. 25, 2015.
Written Opinion of the International Searching Authority of PCT/CN2015/084448 in Chinese, dated Nov. 25, 2015 with English translation.

* cited by examiner

FOLDABLE DISPLAY DEVICE AND DISPLAY APPARATUS

CROSS REFERENCE TO RELATED APPLICATIONS

This application is the National Stage of PCT/CN2015/084448 filed on Jul. 20, 2015, which claims priority under 35 U.S.C. §119 of Chinese Application No. 201510097994.8 filed on Mar. 5, 2015, the disclosure of which is incorporated by reference.

TECHNICAL FIELD

Embodiments of the present disclosure relate to a foldable display device and a display apparatus.

BACKGROUND

With the continuous developing of display technology, a variety of display products with different properties are also produced for meeting different operation requirements. A foldable flexible display device is a new display device with flexibility. When a foldable display device is used by a user, the foldable electric product can be unfolded in order to completely unfold a flexible display screen, to present a large display frame. When the foldable electric product is carried by a user, it can be folded. Although a part of the display frame size may be sacrificed, the foldable electric product would be conveniently carried since it has small size after being folded.

SUMMARY

The embodiments of the disclosure provide a foldable display device and a display apparatus.

According to at least one embodiment of the present disclosure, a foldable display device is provided, which includes a supporting back plate and a display screen arranged in the front side of the supporting back plate; the supporting back plate includes a first supporting part and a second supporting part. The first supporting part and the second supporting part a bendable towards to the reverse side of the supporting back plate through a folding connection. One end of the display screen is fixedly connected to the first supporting part, and the other end of the display screen is slidably connected to the second supporting part. The display screen has a length larger than that of the supporting back plate, one end of the display screen wraps around the tail end of second supporting part and extends to the reverse side of the second supporting part.

According to an embodiment of the present disclosure, a display apparatus is provided. The display apparatus includes the foldable display device.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments and variants can be obtained by those of ordinary skill in the art without creative labor and those embodiments and variants shall fall into the protection scope of the present disclosure.

Unless otherwise defined, all the technical and scientific terms used herein have the same meanings as commonly understood by one of ordinary skill in the art to which the present disclosure belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

A foldable flexible display device usually folds towards to inside of a supporting back plate of a screen. In such folding manner, when the supporting back plate of bearing the flexible screen is folded, due to the extension of the flexible screen at a bending position, the length of the flexible screen in folding state is larger than that of the flexible screen in unfolding state, it causes the flexible screen to be repeatedly stretched and compressed, and this can damage the flexible screen.

Figure 1:
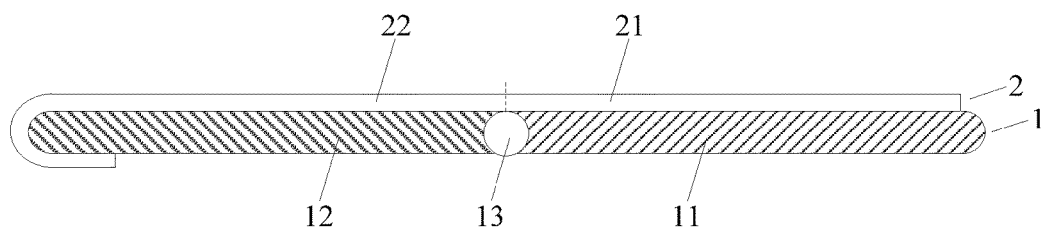
FIG. 1 is a structural schematic view of a foldable display device according to an embodiment of the present disclosure.

The embodiment of the present disclosure provides a foldable display device, as shown in FIG. 1, the foldable display device includes a supporting back plate 1 and a display screen 2 arranged in the front side of the supporting back plate 1.

The supporting back plate 1 includes a first supporting part 11 and a second supporting part 12. The first supporting part 11 and the second supporting part 12 may bend towards to the reverse side of the supporting back plate through a folding connection 13.

One end of the display screen 2 is fixedly connected to the first supporting part 11, and the other end of the display screen 2 is slidably connected to the second supporting part 12.

A length of the display screen 2 is larger than that of the supporting back plate 1, one end of the display screen 2 wraps around the tail end of second supporting part 12 and extends to the reverse side of the second supporting part 12.

The embodiments of the disclosure provides a foldable display device. The foldable display device includes a supporting back plate and a display screen arranged in the front side of the supporting back plate. The supporting back plate further includes a first supporting part and a second supporting part that may be folded to each other. The display screen is fixedly connected to the first supporting part, and the display screen is slidably connected to the second supporting part. As such, when the display device folds towards to inside of the supporting back plate of the screen, the flexible display screen may slide along the supporting back plate, to avoid the flexible screen being stretched. It solves the problem that the length of the flexible screen being in folding state needs to be larger than that of the flexible screen being in horizontal stretching state, so it can effectively avoid the screen being damaged.

It should be noted that in the embodiments, the supporting back plate 1 may include a first supporting part 11 and at least one second supporting parts 12, and any of the second supporting parts 12 may be fixedly connected to one end of the first supporting part 11 through a folding connection 13. All the embodiments of the present disclosure are demonstrated by the supporting back plate 1 including a first supporting part 11 and a second supporting part 12 as an example.

In the foldable display device as shown in FIG. 1, the display screen 2 may include a first display part 21 arranged on a surface of the first supporting part 11 and a second display part 22 arranged on a surface of the second supporting part 12. The first display part 21 is fixedly connected to the first supporting part 11, the first display part 21 may be a rigid display screen, and the second display part 22 may be a flexible display screen. Alternatively, each of the first display part 21 and the second display part 22 is a flexible display screen, as such, when the first supporting part 11 is bent, it would avoid the first display part 21 fixedly connected to the first supporting part 11 being damaged.

In the embodiment of the present disclosure as shown in FIG. 1, the first supporting part 11 may be connected with the second supporting part 12 through a folding shaft 13.

For example, the second display part 22 is connected with the second supporting part 12 through a slide rail.

Figure 2:
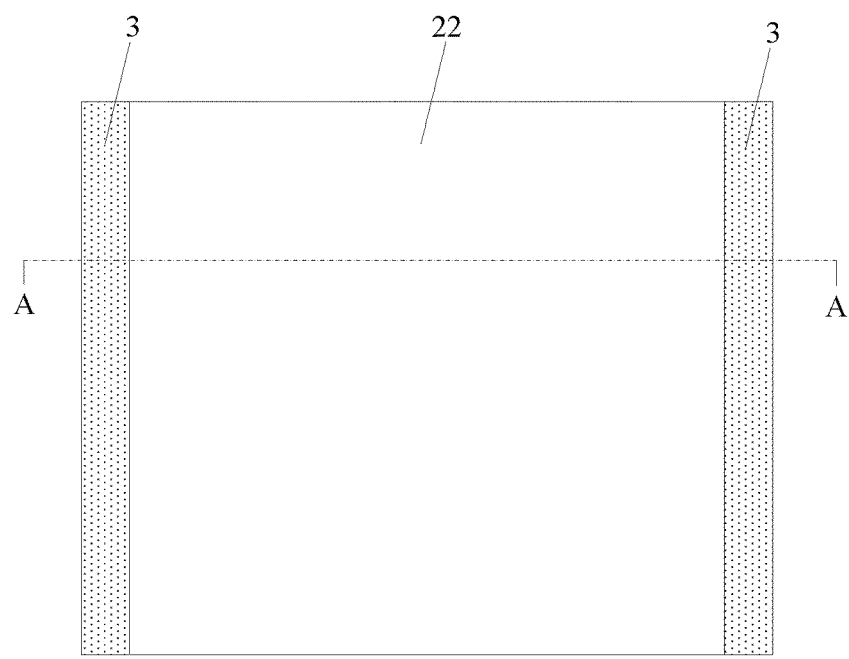
FIG. 2 is a structural schematic view of the front side of a second display part of a display screen according to an embodiment of the present disclosure.
Figure 3:
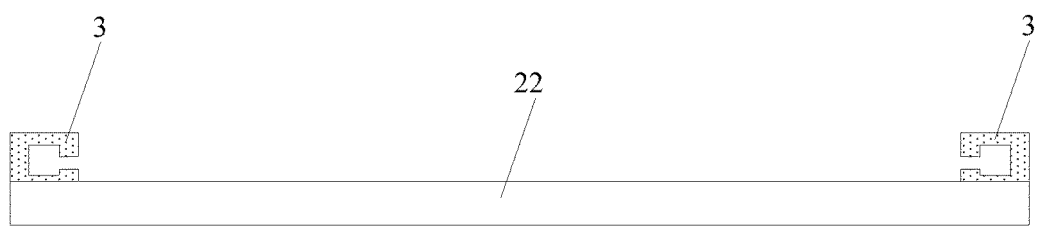
FIG. 3 is a cross-section structural schematic view along A-A of FIG. 2.

For example, as shown in FIG. 2, slide rails 3 may be arranged on the front side, of the second display part 22, facing the second supporting part 12, and be respectively arranged on two sides of the second display part 22 in the length direction. The slide rail 3 has a structure, wherein its cross section structure along A-A is shown as FIG. 3, so that the two sides of the second supporting part 12 are respectively wrapped in the sliding groove, and the second display part 22 may freely slide in the length direction of the second supporting part 12. The foregoing description is only illustrative, it should be noted that it may use a variety of known sliding connection structures for achieving the sliding connection between them.

Figure 4:
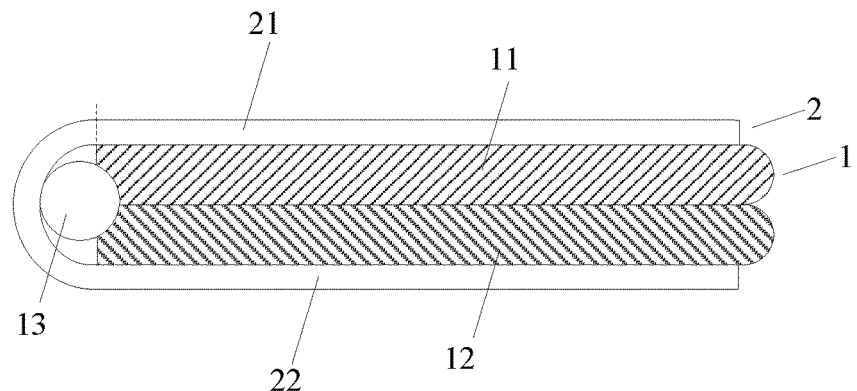
FIG. 4 is a structural schematic view of the foldable display device of FIG. 1 being in folding state.

When the display device becomes a folding state from a unfolding state shown in FIG. 1, as shown in FIG. 4, the second supporting part 12 folds into the reverse side of the first supporting part 11 along the folding shaft 13, while the second display part 22 gradually slides from the reverse side of the second supporting part 12 to the front side of the second supporting part 12. The length of the display screen is larger than or equal to a sum of perimeters of the first supporting part 11, the second supporting part 12 and the folding shaft 13. As such, when the second supporting part 12 is completely folded, a tail end of the second display part 22 may align with a tail end of the second supporting part 12 so that it can prevent the tail end of the second display part 22 from being scratched, and also provide a beautiful structure. When the display device becomes the unfolding state from the folding state, the second display part 22 gradually slides from the front side of the second supporting part 12 to the reverse side of the second supporting part 12.

Figure 5:
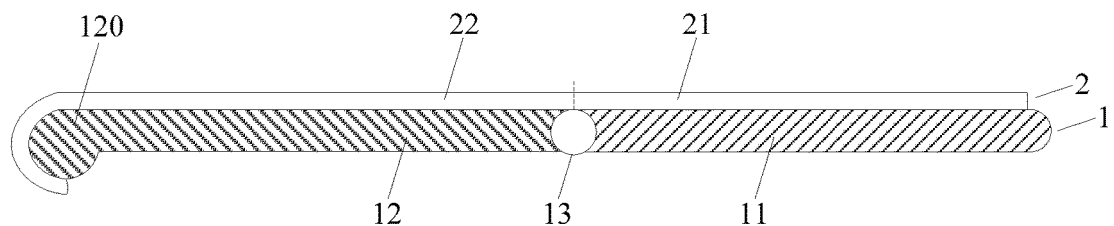
FIG. 5 is a structural schematic view of another foldable display device according to an embodiment of the present disclosure.
Figure 6:
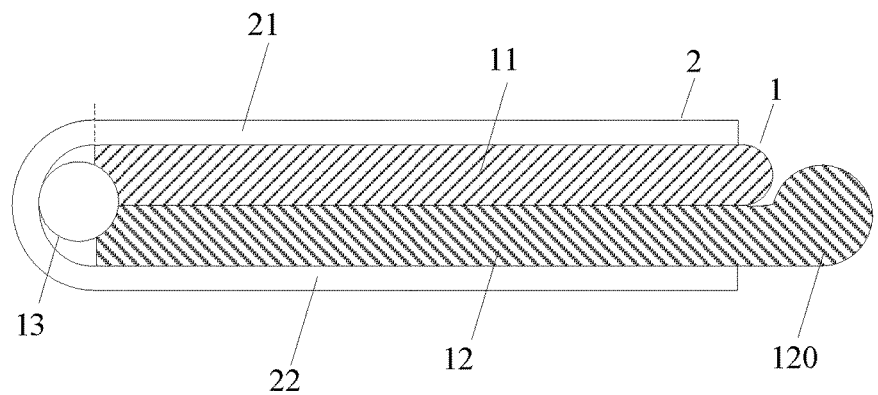
FIG. 6 is a structural schematic view of the foldable display device of FIG. 5 being in folding state.

Using such a foldable display device, when the display device folds towards to the inside of the supporting back plate of the screen, the flexible display screen may slide along the supporting back plate, avoiding the flexible screen being stretched, and it solves the problem that the length of the flexible screen being in folding state needs to be larger than that of the flexible screen being in horizontal stretching state, so it can effectively avoid the screen being damaged Alternatively, the foldable display device provided according to the embodiment of the present disclosure can be the one as shown in FIG. 5. The tail end of the second supporting part 12 may have a round structure 120. When the foldable display device is in the unfolding state, the second display part 22 may wrap on a surface of the round structure 120, and extend to the reverse side of the second supporting part 12.

Similar to the foregoing embodiments, when the display device becomes the folding state from the unfolding state in FIG. 5, as shown in FIG. 5, the second supporting part 12 folds into the reverse side of the first supporting part 11 along the folding shaft 13, while the second display part 22 gradually slides from wrapping on the surface of the round structure 120 to the front side of the second supporting part 12. The length of the display screen may be equal to a sum of perimeters of the first supporting part 11, the second supporting part 12 and the folding shaft 13. As such, when the second supporting part 12 is completely folded, a tail end of the second display part 22 may align with a tail end of the second supporting part 12 so that it can prevent the tail end of the second display part 22 from being scratched, and can provide a beautiful structure. When the display device becomes the unfolding state from the folding state, the second display part 22 gradually slides from the front side of the second supporting part 12 to wrapping on the surface of the round structure 120.

Such kind of round structure 120 can effectively improve the strength of the tail end of the second supporting part 12, and can avoid the tail end deforming under an external force, and substantially reduce the possibility of the screen being damaged. Furthermore, through such kind of structure, when the foldable display device is in the unfolding state, the protruding round structure can also be conveniently hand-held, and considerably improve the use experience of a user.

Figure 7:
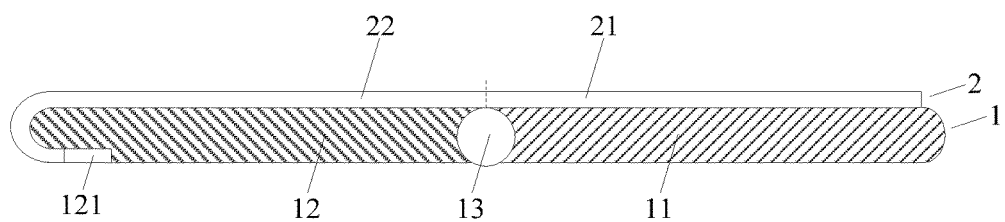
FIG. 7 is a structural schematic view of another foldable display device according to an embodiment of the present disclosure.
Figure 8:
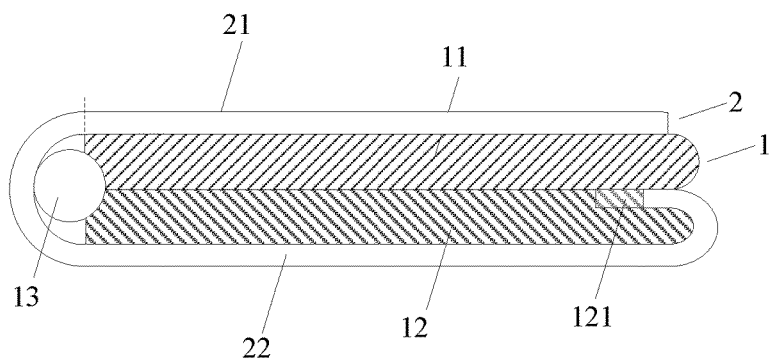
FIG. 8 is a structural schematic view of the foldable display device of FIG. 7 being in folding state.

Alternatively, as shown in FIG. 7, in the embodiment of the present disclosure, a rolling-up structure 121 may be provided on the end of the reverse side of the second supporting part 12.

The tail end of the second display part 22 may be accommodated in the rolling-up structure 121, and a surface of the second display part 22 accommodated in the rolling-up structure 121 is in a same level as a surface of the reverse side of the second supporting part 12. For example, a hollow cavity may be formed in the tail end of the reversed side of the second display part 22, and the height of the hollow cavity is greater than or equal to a thickness of the display screen. A spring structure and a locking or clamping head may be included within the hollow cavity for sliding and fixing the second display part 22.

Similar to the foregoing embodiments, when the display device becomes the folding state from the unfolding state shown in FIG. 7, as shown in FIG. 7, the second supporting part 12 folds into the reverse side of the first supporting part 11 along the folding shaft 13, while the second display part 22 gradually slides along the second supporting part 12, and the tail end of the second display part 22 is kept within the rolling-up structure 121during this operation.

Through such kind of rolling-up structure 121, it can achieve two side surfaces of the second supporting part 12 being leveled with each other in the unfolding state. It can effectively reduce the possibility of the display screen that extends to the reverse side of the second supporting part 12 being collided, and provide a beautiful and fashionable appearance.

It is noted that due to an organic light-emitting diode (OLED) display screen with advantages of low power consumption and high brightness, the display screen may be a flexible OLED display screen in the embodiments of the present disclosure.

A display apparatus is provided according to an embodiment of the present disclosure. The display apparatus includes the foldable display device.

The structure of the foldable display device has already been described in detail in the foregoing embodiments, which is not repeated herein.

The display device may include an OLED panel, a mobile phone, a tablet personal computer, a television, a display, a notebook computer, a digital photo frame, a navigator or any products or components having display function.

The display apparatus provided by the embodiment of the present disclosure includes the foldable display device. The foldable display device includes a supporting back plate and a display screen arranged in the front side of the supporting back plate. The supporting back plate further includes a first supporting part and a second supporting part that may be folded towards each other. The display screen is slidably connected to the second supporting part. As such, when the display device folds towards to inside of the supporting back plate of the screen, the flexible display screen may slide along the supporting back plate, avoiding the flexible screen being stretched, and it solves the problem that the length of the flexible screen in folding state needs to be larger than that of the flexible screen in horizontal stretching state, so it can effectively avoid the screen being damaged.

The described above are only illustrative embodiments and implementations for explaining principle of the present disclosure, and the present disclosure is not intended to limited thereto. Various modifications, improvements and equivalents may be made without departing from the spirit and scope of embodiments of the present disclosure, and all of which shall fall within the protection scope of the present disclosure.

The present application claims priority of Chinese patent application No. 201510097994.8 filed on Mar, 5, 2015 and entitled "FOLDABLE DISPLAY DEVICE AND DISPLAY APPARATUS", the contents of which are incorporated herein by reference entirely.

What is claimed is:

1. A foldable display device, comprising:
a supporting back plate; and
a display screen including a first display part and a second display part arranged in the front side of the supporting back plate;
wherein the supporting back plate includes a first supporting part and a second supporting part, the first display part being arranged on a surface of the first supporting part and the second display part being arranged on a surface of the second supporting part, and the first supporting part and the second supporting part can bend towards to the reverse side of the supporting back plate through a folding connection;
one end of the display screen is fixedly connected to the first supporting part, and the other end of the display screen is slidably connected to the second supporting part; and
the display screen has a length larger than that of the supporting back plate, and one end of the display screen wraps around a tail end of second supporting part and extends to the reverse side of the second supporting part, the tail end of the second supporting part having a round structure protruding from surfaces of the second supporting part to improve the strength of the tail end of the second supporting part, and configured to be wrapped by the second display part when the foldable display device is in the unfolding state.

2. The foldable display device according to claim 1, wherein
the first display part is a rigid display screen.

3. The foldable display device according to claim 2, wherein the second display part is connected with the second supporting part through a slide rail.

4. The foldable display device according to claim 2, wherein the second display part is a flexible display screen.

5. The foldable display device according to claim 1, wherein
each of the first display part and the second display part is a flexible display screen.

6. The foldable display device according to claim 1, wherein the first supporting part is connected with the second supporting part through a folding shaft.

7. The foldable display device according to claim 6, wherein the length of the display screen is larger than or equal to a sum of perimeters of the first supporting part, the second supporting part and the folding shaft.

8. The foldable display device according to claim 1, wherein the display screen comprises a flexible OLED display screen.

9. A display apparatus, comprising a foldable display device wherein the foldable display device, comprising:
a supporting back plate; and
a display screen including a first display part and a second display part arranged in the front side of the supporting back plate;
wherein the supporting back plate includes a first supporting part and a second supporting part, the first display part being arranged on a surface of the first supporting part and the second display part being arranged on a surface of the second supporting part, and the first supporting part and the second supporting part can bend towards to the reverse side of the supporting back plate through a folding connection;

one end of the display screen is fixedly connected to the first supporting part, and the other end of the display screen is slidably connected to the second supporting part; and the display screen has a length larger than that of the supporting back plate, and one end of the display screen wraps around a tail end of second supporting part and extends to the reverse side of the second supporting part, the tail end of the second supporting part having a round structure protruding from surfaces of the second supporting part to improve the strength of the tail end of the second supporting part, and configured to be wrapped by the second display part when the foldable display device is in the unfolding state.

10. The display apparatus according to claim 9, wherein the first supporting part is connected with the second supporting part through a folding shaft.

11. The display apparatus according to claim 10, wherein the length of the display screen is larger than or equal to a sum of perimeters of the first supporting part, the second supporting part and the folding shaft.

12. The display apparatus according to claim 9, wherein the second display part is connected with the second supporting part through a slide rail.

13. The display apparatus according to claim 9, wherein the first display part is a rigid display screen.

14. The foldable display device according to claim 13, wherein the second display part is a flexible display screen.

15. The display apparatus according to claim 9, wherein each of the first display part and the second display part is a flexible display screen.

* * * * *